(12) United States Patent
Deveau et al.

(10) Patent No.: US 8,933,702 B2
(45) Date of Patent: Jan. 13, 2015

(54) BATTERY MONITOR WITH CORRECTION FOR INTERNAL OHMIC MEASUREMENTS OF BATTERY CELLS IN PARALLEL CONNECTED BATTERY STRINGS

(75) Inventors: Edward W. Deveau, Pompano Beach, FL (US); Xiaoquan Bie, Boca Raton, FL (US)

(73) Assignee: Liebert Corporation, Columbus, OH (US)

( * ) Notice: Subject to any disclaimer, the term of this patent is extended or adjusted under 35 U.S.C. 154(b) by 898 days.

(21) Appl. No.: 13/106,324

(22) Filed: May 12, 2011

(65) Prior Publication Data

US 2012/0119745 A1 May 17, 2012

Related U.S. Application Data

(60) Provisional application No. 61/334,695, filed on May 14, 2010.

(51) Int. Cl.
*G01N 27/416* (2006.01)
*G01R 31/36* (2006.01)

(52) U.S. Cl.
CPC ........ *G01R 31/3658* (2013.01); *G01R 31/3631* (2013.01); *G01R 31/3662* (2013.01)
USPC .......................................... 324/429; 324/430

(58) Field of Classification Search
USPC ........................................................ 324/429
See application file for complete search history.

(56) References Cited

U.S. PATENT DOCUMENTS 4,707,795 A 11/1987 Alber et al.
5,705,929 A 1/1998 Caravello et al.
(Continued)

FOREIGN PATENT DOCUMENTS

| FR | 2754395 A1 | 4/1998 |
|----|------------|--------|
| GB | 1514182 A | 6/1978 |

(Continued)

OTHER PUBLICATIONS

Notification of Transmittal of the International Search Report and the Written Opinion of the International Searching Authority for PCT/US2011/036406, mailed Sep. 5, 2011.
(Continued)

*Primary Examiner* — Drew A Dunn
*Assistant Examiner* — Robert Grant
(74) *Attorney, Agent, or Firm* — Harness, Dickey & Pierce, P.L.C.

(57) ABSTRACT

A battery monitor determines an internal resistance of a battery cell of a battery having parallel connected battery strings which accounts for errors introduced by the parallel connected battery strings. When determining the internal resistance of a battery cell, the battery monitor determines a baseline intercell resistance of an intercell connecting the negative terminal of the battery cell to the positive terminal of an adjacent battery. The battery monitor then applies a momentary load across the battery cell and immediately prior to releasing the load, measures the voltage across the battery cell (loaded voltage) and the voltage across the intercell. The battery monitor then calculates the current flowing through the intercell (intercell current) by dividing the measured voltage across the intercell by the determined intercell resistance. Immediately after releasing the load, the battery monitor measures the voltage across the battery cell (recovered voltage) and determines the battery cell internal resistance by dividing the difference between the recovered voltage and the loaded voltage by the intercell current.

14 Claims, 5 Drawing Sheets

(56) References Cited

U.S. PATENT DOCUMENTS

| | | | |
|---|---|---|---|
| 5,744,962 A * | 4/1998 | Alber et al. | 324/426 |
| 5,969,625 A | 10/1999 | Russo | |
| 6,167,349 A | 12/2000 | Alvarez | |
| 6,332,113 B1 | 12/2001 | Bertness | |
| 6,417,646 B1 | 7/2002 | Huykman et al. | |
| 6,534,993 B2 | 3/2003 | Bertness | |
| 6,812,674 B2 | 11/2004 | Hoffman | |
| 7,212,006 B2 | 5/2007 | Huang | |
| 7,545,146 B2 | 6/2009 | Klang et al. | |
| 7,567,085 B2 | 7/2009 | Kim et al. | |
| 7,710,119 B2 | 5/2010 | Bertness | |
| 7,772,852 B2 | 8/2010 | Fechalos et al. | |
| 8,035,396 B2 | 10/2011 | Kim | |
| 8,063,643 B2 | 11/2011 | Deveau et al. | |
| 8,131,487 B2 | 3/2012 | Thibedeau et al. | |
| 2005/0206388 A1 | 9/2005 | Quint et al. | |
| 2006/0017444 A1 * | 1/2006 | Fechalos et al. | 324/433 |
| 2008/0303528 A1 | 12/2008 | Kim | |
| 2009/0027006 A1 | 1/2009 | Vezzini et al. | |
| 2009/0224771 A1 | 9/2009 | Deveau et al. | |
| 2011/0101986 A1 | 5/2011 | Shen et al. | |

FOREIGN PATENT DOCUMENTS

| | | |
|---|---|---|
| JP | 9054147 A | 2/1997 |
| WO | WO-0235677 A1 | 5/2002 |

OTHER PUBLICATIONS

IEEE 1188-2005—Requirements and Battery Tester Capability Interconnection Resistance Measurement and Data Analysis: Managing the Task.

Cellcorder—The Resistance Tester CRT-400 © 2007.

Predicting Battery Performance Using Internal Cell Resistance © 1999.

Comparison of Several Methods for Determining the Internal Resistance of Lithium Ion Cells, Jun. 3, 2010.

* cited by examiner

BATTERY MONITOR WITH CORRECTION FOR INTERNAL OHMIC MEASUREMENTS OF BATTERY CELLS IN PARALLEL CONNECTED BATTERY STRINGS

CROSS-REFERENCE TO RELATED APPLICATIONS

This application claims the benefit and priority of U.S. Provisional Application No. 61/334,695, filed May 14, 2010. The entire disclosure of the above application is incorporated herein by reference.

FIELD

The present disclosure relates to battery monitors that determine internal resistance of battery cells in a battery system.

BACKGROUND

Uninterruptible power supply systems, such as those used for telecommunications/data centers, often utilize batteries as the source of back-up power. Each battery typically has multiple cells or multicell modules connected in series to provide the requisite voltage, commonly referred to as a battery string. The term "cell" will be used herein to refer to both individual cells and multicell modules of a battery string unless the context dictates otherwise. The individual battery cells adjacent to each other in a section of a battery string are connected to each other by a conductive connector, such as a copper bus bar, strap, cable or the like. This connector is commonly referred to as an intercell or intercell connector. Adjacent sections of a battery string are connected to each other by a longer conductive connector, such as a cable or group of cables (that are longer than cables used for intercell connectors), referred to as an intertier or intertier connector.

Since a battery has a finite life, it will eventually fail. Consequently, battery monitors are often used to monitor the batteries in UPS systems. By detecting battery problems at an early stage before they can cause abrupt system failure, system reliability is improved.

One type of battery monitor used to monitor the batteries in UPS systems monitors the state of health of each cell in a battery string and depending on the configuration of the monitor, may monitor one or several batteries with each battery having one or more battery strings of cells connected in series. The battery strings may be connected in series, in parallel, or in a combination of series and parallel connected strings. In battery monitors available from Alber of Pompano Beach, Fla., such as the BDS series of battery monitors, the internal resistance of each cell in the battery string of each battery is measured as the internal resistance of a cell is a reliable indicator of that cell's state of health. The battery monitors also monitor other parameters, such as cell voltage, overall voltage, ambient temperature of the battery, intercell resistance, intertier resistance, discharge current, discharge events, float current, and the like. The battery monitors will alert a user if the monitored data shows a problem with the batteries being monitored. The battery monitors typically interface to a computer, local or remote, that is programmed to display the monitored data.

Battery monitors typically utilize an AC current injection method or a momentary load test method to measure battery impedance or resistance, respectively. In the momentary load test method, the battery is subjected to a momentary load (e.g., a resistance) and the instantaneous change in voltage across the battery is measured. More specifically, a momentary load is applied to the battery. This generates a test current, such as ten or twenty amps, that flows through the battery cell. The current flowing through the load (and thus also through the battery) and the voltage across the battery terminals are measured immediately prior to removal of the load. The current may be measured with an on-board current shunt in a known manner. The recovered battery voltage is then measured after removal of the load. The battery resistance is then calculated using Ohm's law by $R_{batt}=\Delta V/I$ where $R_{batt}$ is the internal resistance of the battery, $\Delta V$ is the recovered battery voltage minus the battery voltage immediately before removal of the load, and I is the current flowing through the battery and load. It should be understood that the above technique can be used with an entire battery, a battery string in a battery that has a plurality of battery strings, and to individual battery cells and the use of the term battery in the description of this technique is generic to an entire battery, a battery string and a battery cell.

The battery monitors may for example utilize the teachings of U.S. Pat. No. 4,707,795 for "Battery Testing and Monitoring System" issued Nov. 17, 1987 and/or U.S. Pub. No. 2009/0224771 for "System and method for Measuring Battery Internal Resistance," published Sep. 10, 2009, the entire disclosures of which are incorporated herein by reference.

FIG. 1 shows a prior art battery monitor 100 coupled to a battery string 102. Battery string 102 includes a plurality of battery cells 104 with adjacent battery cells connected to each other by an intercell 106. Battery string 102 may include a plurality of battery string sections 108 with adjacent battery string sections 108 connected to each other by an intertier 110. While battery string 102 is shown in FIG. 1 as having two battery string sections 108, it should be understood that battery string 102 may have more than two battery sections 108, with adjacent battery sections connected by an intertier 110, or just one battery section 108.

The positive and negative terminals of each battery cell 104 are connected to respective voltage sense leads 112 which are connected to appropriate voltage measurement inputs of battery monitor 100, which are coupled to a voltage sense circuit of battery monitor 100 which measures voltage. To simplify the figure, only three such voltage sense leads 112 are shown with only two shown coupled to battery monitor 100. Illustratively, the inputs of battery monitor 100 to which voltage sense leads 112 are connected are coupled through a multiplexer to the voltage sense circuit, allowing these inputs to be switched between positive and negative inputs of the voltage sense section. The positive terminals of each battery cell 104 are also connected to respective test load inputs of battery monitor 100 by test load leads 114. Again to simplify the figure, only two such test load leads 114 are shown. Illustratively, battery monitor 100 includes a controller 116, such as a microprocessor or microcontroller, that is programmed with software implementing the control of battery monitor 100.

Battery monitor 100 measures, among other parameters, the internal resistance of the battery cells 104 using the momentary load method as described above. Battery monitor 100 includes a load module (not shown) having one or more resistances that are selectively coupled via test load leads 114 to battery string 102, individual battery string sections 108, or individual battery cells 104 to apply the momentary load.

Battery monitor 100 also measures the intercell and intertier resistances. The flow chart of FIG. 2 shows in simplified form a method that battery monitor 100 uses to determine the resistance of intercell and intertiers. The method is described with reference to an intercell, but it should be understood that it is also applicable to intertiers.

At 200, battery monitor 100 applies a test load across a battery cell 104 and the intercell 106 connected to the negative terminal of that battery cell 104 via test load leads 114 that are connected, respectively, to the positive terminal of the battery cell 104 and the positive terminal of the adjacent battery cell 104. This causes a test current, such as ten or twenty amps, to flow through battery cell 104 and the adjacent intercell 106. At 202, battery monitor 100 measures, using voltage sense leads 112, the voltage drop across intercell 106 while the test current is flowing through the battery cell 104 and the intercell 106. Again, the test current may be measured by the monitor 100 with an on-board current shunt in a known manner. At 204, battery monitor 100 then calculates the resistance across intercell 106. More specifically, intercell resistance is computed by dividing the voltage drop across the intercell by the value of the test current in accordance with Ohm's law. At 206, battery monitor 100 checks to see if a requisite sample size of resistances has been obtained. If not, it repeats steps 200-204. If so, it then averages the samples at 208 to arrive at a final resistance of intercell 106 ($R_{ic}$). The requisite sample size is the number samples so that when averaged, the resulting final resistance of intercell 106 reflects the actual resistance of intercell 106. This sample size may illustratively be determined in any known fashion, such as heuristically and may be, by way of example and not of limitation, 1024 samples.

Performing ohmic measurements on small parallel battery strings, such as those that are sometimes used in telecommunication systems, using the momentary load method can result in an error due to leakage paths of the test current used to obtain the readings, as illustrated in J. McDowall, "Parallel Strings—Parallel Universe," (Battcon 2002). With reference to FIG. 3, a battery 300 has two parallel battery strings 304. When battery monitor 100 applies the momentary load to battery cell 302, the test current flows both in path 306, shown with solid lines, through battery cell 302 and battery monitor 100 and also in path 308, shown with dashed lines, through battery cells 302' (which are in series with each other and in parallel with battery cell 302 when the momentary load is applied to battery cell 302) and battery monitor 100. Consequently, the resulting ohmic measurement is altered because of the parallel connection of battery cell 302 with the series/parallel connected battery cells 302'. Therefore, it is desirable to provide an improved technique for determining internal resistance of a battery cell in a battery having parallel battery strings.

This section provides background information related to the present disclosure which is not necessarily prior art.

SUMMARY

In accordance with an aspect of the present disclosure, a battery monitor determines the internal resistance of a battery cell of a battery having parallel connected battery strings and corrects for errors introduced by the parallel connected battery strings. When determining the internal resistance of a battery cell, the battery monitor determines the intercell resistance of an intercell connecting the negative terminal of the battery cell to the positive terminal of an adjacent battery. The battery monitor then applies a momentary load across the battery cell and immediately prior to releasing the load, measures the voltage across the battery cell (loaded voltage) and the voltage across the intercell. The battery monitor then calculates the current flowing through the intercell (intercell current) by dividing the measured voltage across the intercell by the determined intercell resistance. Immediately after releasing the load, the battery monitor measures the voltage across the battery cell (recovered voltage) and determines the battery cell internal resistance by dividing the difference between the recovered voltage and the loaded voltage by the intercell current.

In one aspect, the battery monitor measures float current and adjusts the calculated intercell current used in determining the internal resistance of the battery cell by the float current.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

DRAWINGS

Figure 1:
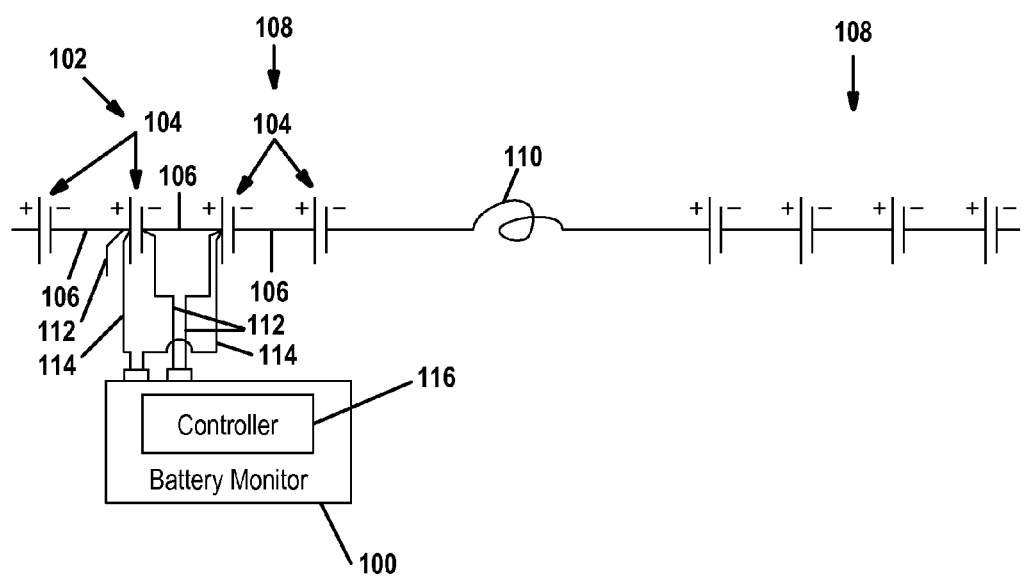
FIG. 1 is a simplified schematic of a prior art battery monitoring system.
Figure 2:
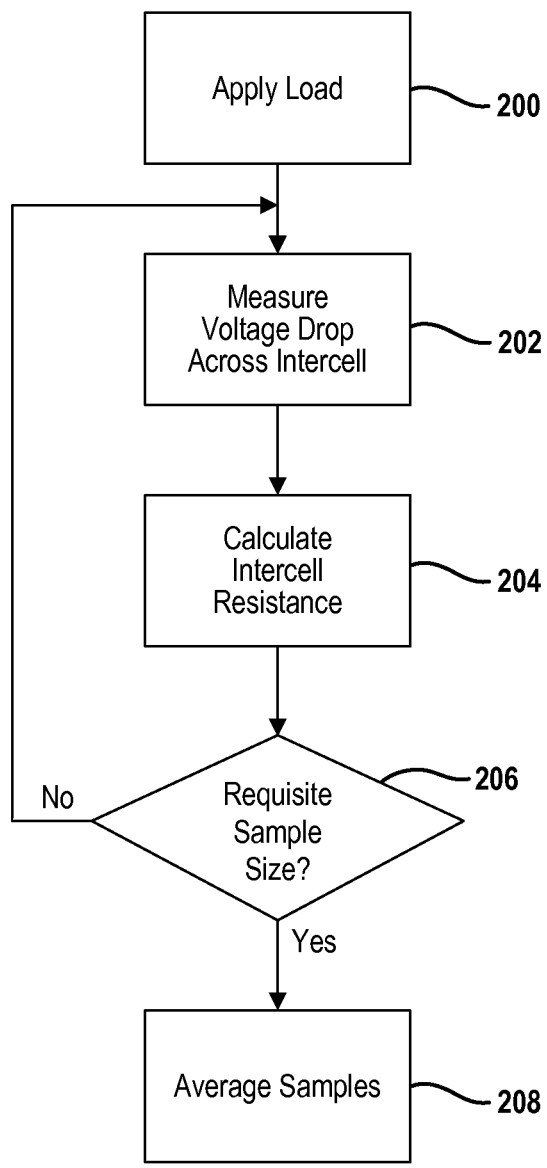
FIG. 2 is a flow chart showing a program for the battery monitor of FIG. 1 to determine the resistance of an intercell.
Figure 3:
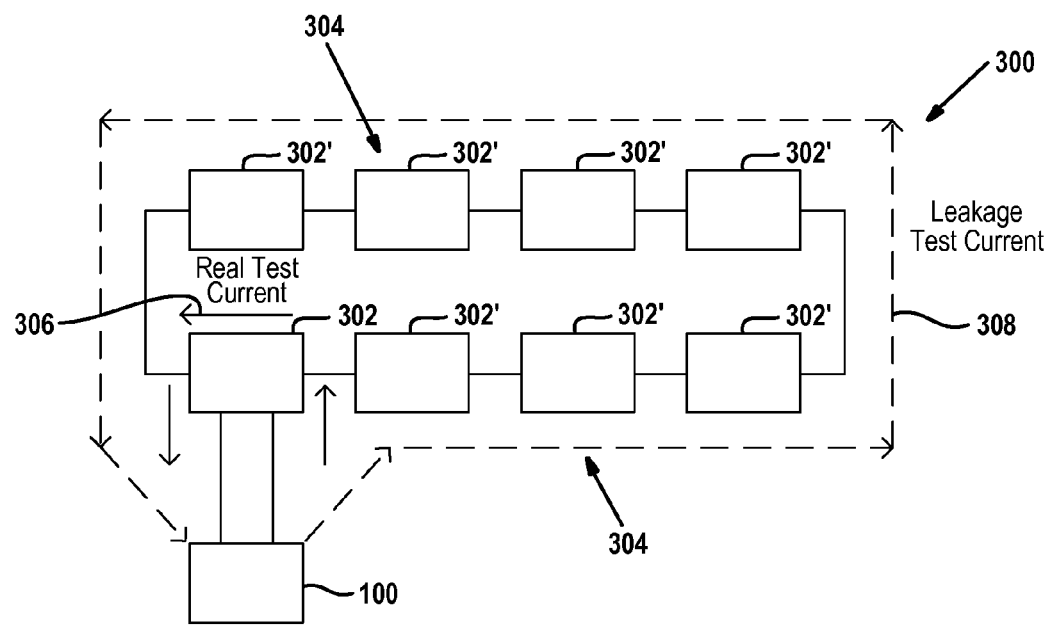
FIG. 3 is a simplified schematic showing current paths in a battery having parallel connected battery.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

Example embodiments will now be described more fully with reference to the accompanying drawings.

Figure 4:
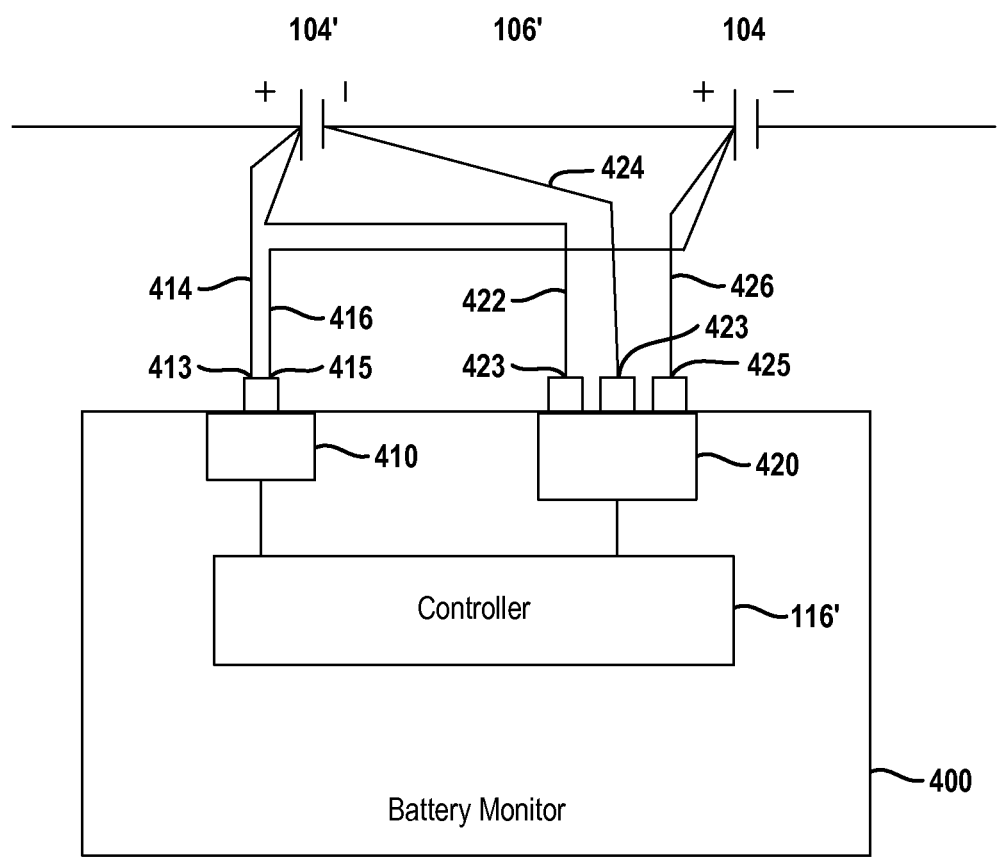
FIG. 4 is a simplified schematic of a battery monitor in accordance with an aspect of the present disclosure.

Referring to FIG. 4, a battery monitor 400 in accordance with an aspect of the present disclosure is shown coupled to a battery 402 that includes two parallel connected battery strings 404. Each battery string 404 is shown as including four series connected battery cells 104. But it should be understood that this is exemplar and battery 402 can include more or less than two battery strings 404 and battery strings 404 can include more or less than four battery cells 104. While the below described method of determining the resistance of a battery cell 104 finds particular benefit when battery 402 includes parallel connected battery strings 404, it can be utilized with a battery having only series connected battery strings, or a single battery string.

Battery monitor 400 is comprised generally of a test load circuit 410, a voltage sense circuit 420, and a controller 116'. The test load circuit further includes a pair of test load inputs. One of test load inputs 413 is coupled by a test load lead 414 to a positive terminal of one of battery cells 104 and the other test load input 415 is coupled by another test load lead 416 to a positive terminal of an adjacent battery cell 104. The voltage sense circuit 420 further includes at least three voltage sense inputs. In an exemplary embodiment, a first voltage sense input 421 is coupled by voltage sense lead 422 to a positive terminal of battery cell 104', a second voltage sense input 423 is coupled by voltage sense lead 424 to a negative terminal of battery cell 104' and a third voltage sense input 425 is coupled by voltage sense lead 426 to a positive terminal of adjacent battery cell 104. In this way, the voltage sense circuit 420 can measure voltage drops across battery cell 104' using first and second voltage sense inputs and measure voltage across the intercell connection 106' using second and third voltage sense inputs. In another embodiment, the voltage sense circuit 420 may employ two pairs of voltage sense inputs; one pair for coupling across battery cell 104' and the other pair for coupling across intercell connection 106'. It should be understood, however, that voltage sense inputs could alternatively be connected to opposed sides of an intertier 110 where the adjacent battery cells 104 are in adjacent battery strings.

Test load circuit 410 may illustratively be any type of known circuit for connecting a load across elements of a battery string, such as the test load circuits used in the BDS series of battery monitors discussed above or the test load circuit described in U.S. Pat. No. 4,707,795 or U.S. Pub. No. 2009/0224771 referenced above. Voltage sense circuit 420 may be any type of circuit used in measuring voltage, such as the voltage sense circuits used in the BDS series of battery monitors discussed above or the voltage sense circuits described in U.S. Pat. No. 4,707,795 or U.S. Pub. No. 2009/0224771 referenced above. In this regard, voltage sense circuit 420 includes an analog-to-digital converter that digitizes the voltage signal at voltage sense inputs. It may also include an analog gain section that amplifies the voltage signal at voltage sense inputs before that signal is digitized.

Battery monitor 400 further includes a controller 116', such as a microprocessor, microcontroller, application specific integrated circuit, or the like. Controller 116' is configured, such as by appropriate software programmed into it, to operate battery monitor 400 to measure the resistance of battery cells 104 in a manner that eliminates the error introduced by the parallel connected battery strings discussed above. This method is discussed with reference to a single battery cell 104, designated 104' and the intercell 106, designated 106', connecting the negative terminal of battery cell 104' to the positive terminal of the adjacent battery cell 104.

Figure 5:
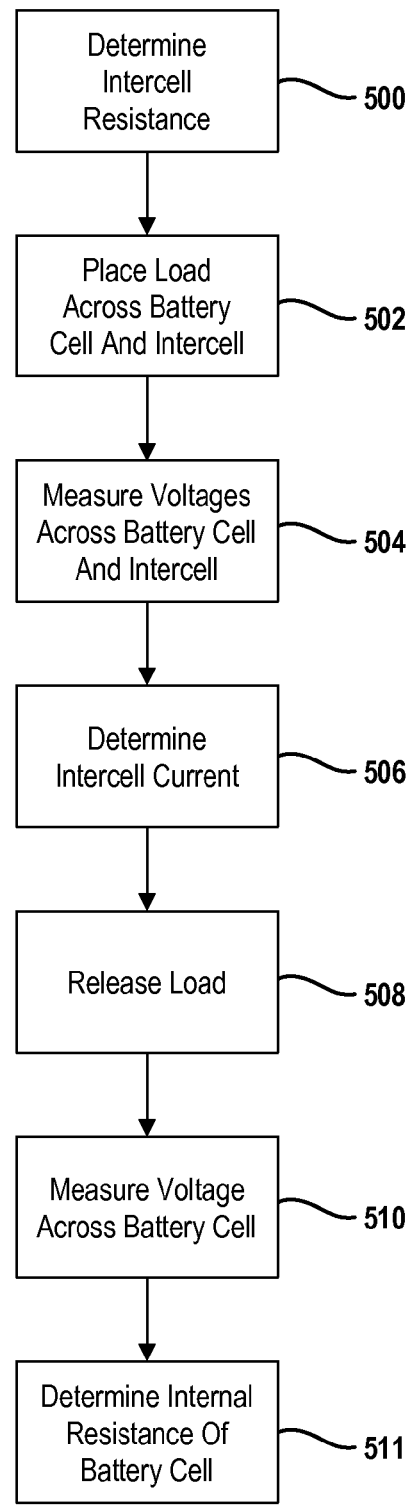
FIG. 5 is flow chart showing an aspect of a program for controlling the battery monitor of FIG. 4 to measure the internal resistance of a battery cell in accordance with an aspect of the present disclosure.

With reference to FIG. 5, an exemplary method is further described for determining resistance of a battery cell in a battery system. At 500, battery monitor 400 determines the resistance of intercell 106' ($R_i$). During commission or setup of the system, the battery strings would be isolated from each other. Once isolated, the battery monitor 400 could determine the resistance of each intercell of interest in the manner described above for battery monitor 100. Since there are no leakage currents to be concerned with, these resistance values would then serve as a set of baseline resistance values for computations further described below. Other techniques for determining resistance of an intercell also fall within the broader aspects of this disclosure.

Battery monitor 400 then puts a load across battery cell 104' and intercell 106' at 502; that is, across the positive terminal of battery cell 104' and the positive terminal of the adjacent battery cell 104 that is connected to the negative terminal of battery cell 104' by intercell 106'. At 504, after waiting a short delay and immediately before releasing the load across battery cell 104' and intercell 106', battery monitor 400 measures the voltage across battery cell 104' (which will be referred to herein as the loaded battery cell voltage) and also measures the voltage across intercell 106' ($V_i$).

Next, battery monitor determines the current flowing through intercell 106' at 506, which is also the current flowing though battery cell 104'. It does so in accordance with Ohm's law by dividing the voltage that it measured across intercell 106' by the previously determined baseline resistance of intercell 106'. That is, $I_i = V_i/R_i$ where $I_i$ is the current flowing through intercell 106' (referred to herein as the intercell current), $V_i$ is the voltage measured across intercell 106' and $R_i$ is the previously determined baseline resistance of intercell 106'.

Battery monitor 400 then releases the load across battery cell 104' and intercell 106' at 508 and immediately after releasing the load, measures the voltage across battery cell 104' at 510 (which will be referred to herein as the recovered battery cell voltage). At 511, battery monitor 400 determines the internal resistance of battery cell 104' in accordance with Ohm's law by $R_{cell} = \Delta V/I_i$ where $R_{cell}$ is the internal resistance of the battery cell 104', $\Delta V$ is the recovered battery cell voltage minus the loaded battery cell voltage, and $I_i$ is the previously determined intercell current.

In an aspect, battery monitor 400 also determines the float current flowing in the battery string 404 and uses the float current to adjust the intercell current used in determining the internal resistance of battery cell 104'. Float current is the current that flows through a battery string when the battery string is unloaded. One technique for measuring the float current of a battery string is utilizing the technique described in U.S. Provisional Application No. 61/334,709 filed May 14, 2010, the entire disclosure of which is incorporated herein by reference. Other techniques for determining float current (e.g., one or more Hall effect sensors) are also contemplated within the broader aspects of this disclosure.

Illustratively, it does so by subtracting the float current from the intercell current determined at 506, assuming that the float current and intercell current determined at 506 are flowing in the same direction. If the intercell current determined at 506 and the float current are flowing in opposite directions, the float current is added to the intercell current determined at 506 to adjust the intercell current used in determining the internal resistance of battery cell 104'.

Determination of float current across multiple intercell connections could be used to validate changes in the baseline intercell resistance values. An exemplary process would measure voltage across multiple intercell connectors in a battery string and calculate the float current through each intercell connector by dividing the voltage by the corresponding baseline intercell resistance value. Calculated float currents are then compared to each other. Since the float current should be the same, an alarm condition could be triggered by the monitor if any one of the float current are not within an acceptable tolerance. In this way, unacceptable changes in baseline intercell resistance values could be detected.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A system for determining resistance of a battery cell in a battery string, comprising:
a voltage sense circuit operable to measure a voltage drop across a first battery cell in a first string of battery cells and to measure a voltage drop across an intercell connection between the first battery cell and a second adjacent battery cell, where a negative terminal of the first battery cell coupled by the intercell connection to a positive terminal of the second battery cell and the first string of battery cells is coupled in parallel with a second string of battery cells;

a test load circuit that operates to apply a load across the first battery cell and the intercell connection; and a controller in data communication with the voltage sense circuit, wherein the controller determines a baseline resistance of the intercell connection while the first string of battery cells is electrically isolated from the second string of battery cells and stores the baseline resistance of the intercell connection for subsequent processing, wherein the controller is configured to receive a voltage drop measured across the first battery cell while the load is applied and immediately after the load is released, the controller determines a voltage difference between the voltage drop across the first battery cell while the load is applied and the voltage drop across the first battery cell promptly after releasing the load, determines a current through the intercell connection by dividing a voltage drop measured across the intercell connection by the baseline resistance of the intercell, and determines an internal resistance of the first battery cell from the voltage difference and the current through the intercell connection, where the internal resistance is determined from voltage measures taken while the first string of battery cells is coupled in parallel with a second string of battery cells.

2. The system of claim 1 wherein the test load circuit operates to measure current through the applied load when the first string of battery cells is electrically isolated from the second string of battery cells and the controller determines baseline resistance of the intercell connection from the voltage drop across the intercell connection and the current through the applied load using Ohms law.

3. The system of claim 1 wherein the voltage sense circuit has voltage sense inputs that are electrically coupled across the first battery cell and across the intercell connection.

4. The system of claim 1 wherein the controller determines a float current in the first battery cell and adjusts the current through the intercell connection prior to determining the internal resistance of the first battery cell.

5. The system of claim 1 wherein the controller determines a float current in two or more intercell connections in the battery string and validates baseline resistances for each of the intercell connections by comparing the float currents of the intercell connections to each other.

6. The system of claim 1 is incorporated into a battery monitor device.

7. A battery monitor device, comprising:
a voltage sense circuit electrically coupled across a first battery cell and to a positive terminal of a second battery cell, where a negative terminal of the first battery cell coupled by the intercell connection to a positive terminal of the second battery cell, the voltage sense circuit operates to measure a voltage drop across the first battery cell and to measure a voltage drop across the intercell connection between the first battery cell and the second battery cell, where the first battery cell is coupled in series with the second battery cell to form a first string of battery cells;

a test load circuit electrically coupled across the first battery cell and the intercell connection and operates to apply a load across the first battery cell and the intercell connection; and a controller in data communication with the first voltage sense circuit, wherein the controller determines a baseline resistance of the intercell connection while the first string of battery cells is electrically isolated from the second string of battery cells and stores the baseline resistance of the intercell connection for subsequent processing, wherein the controller is configured to receive a voltage drop measure across the first battery cell while a load is applied and promptly after the load is released and to determine a voltage difference between the voltage drop across the first battery cell while the load is applied and the voltage drop across the first battery cell promptly after releasing the load, the controller further determines a current through the intercell connection from a voltage drop measured across the intercell connection and the baseline resistance of the intercell and determines an internal resistance of the first battery cell from the voltage difference and the current through the intercell connection, where the internal resistance is determined from voltage measures taken while the first string of battery cells is coupled in parallel with a second string of battery cells.

8. The battery monitor of claim 7 wherein the test load circuit operates to measure current through the applied load and the controller determines resistance of the intercell connection from the voltage drop across the intercell connection and the current through the applied load using Ohms law.

9. The battery monitor of claim 7 wherein the controller determines a float current in the first battery cell and adjusts the current through the intercell connection prior to determining the internal resistance of the first battery cell.

10. A method for determining resistance of a battery cell in a battery string of a battery system, comprising:
measuring a voltage drop across a first battery cell in a first battery string while a load is applied across the first battery cell in a first string of battery cells, a negative terminal of a first battery cell coupled by an intercell connection to a positive terminal of an adjacent second battery cell and the first string of battery cells is coupled in parallel with a second string of battery cells;

measuring a voltage drop across the first battery cell promptly after releasing the load across the first battery cell;

determining a voltage difference between the voltage drop across the first battery cell while the load is applied and the voltage drop across the first battery cell promptly after releasing the load;

determining a baseline resistance of the intercell connection prior to the steps of measuring a voltage drop and while the first string of battery cells is electrically isolated from the second string of battery cells;

measuring a voltage drop across the intercell connection while the load is applied;

determining current through the intercell connection by dividing the voltage drop across the intercell connection by the baseline resistance of the intercell; and determining an internal resistance of the first battery cell from the voltage difference and the current through the intercell connection.

11. The method of claim 10 further comprises determining the current through the intercell connection from the voltage drop across the intercell connection and the resistance of the intercell connection using Ohms law.

12. The method of claim 10 further comprises determining resistance of the intercell connection from the voltage drop across the intercell connection and the current through the intercell connection using Ohms law.

13. The method of claim 10 further comprises determining a float current in the first battery cell and adjusting the current through the intercell connection prior to determining the internal resistance of the first battery cell.

14. The method of claim 10 further comprises determining a float current in two or more intercell connections in the battery string and validating baseline resistances for each of the intercell connections by comparing the float currents of the intercell connections to each other.

* * * * *